US006062338A

United States Patent [19]

Thompson

[11] Patent Number: 6,062,338

[45] Date of Patent: May 16, 2000

[54] LOUD SPEAKER ENCLOSURE

[76] Inventor: Michael A. Thompson, 3914 S. 322nd St., Auburn, Wash. 98001

[21] Appl. No.: 08/927,548

[22] Filed: Sep. 6, 1997

[51] Int. Cl.[7] .......... H05K 5/00

[52] U.S. Cl. .......... 181/152; 181/156

[58] Field of Search .......... 181/152, 155, 181/156, 199, 144, 145, 154; 381/156, 158, 159, 160

[56] References Cited

U.S. PATENT DOCUMENTS

| | | | |
|---|---|---|---|
| 2,224,919 | 12/1940 | Olson | 181/156 |
| 4,213,515 | 7/1980 | Laupman | 181/156 |
| 5,105,905 | 4/1992 | Rice | 181/155 |
| 5,432,860 | 7/1995 | Kasajima et al. | 181/152 |

*Primary Examiner*—Khanh Dang

*Attorney, Agent, or Firm*—Tim A. Cheatham

[57] ABSTRACT

A speaker enclosure for controlling an air pressure differential across a front and rear portion of a speaker cone comprising an enclosed rear chamber in communication with a primary channel having a constant cross-section, the primary channel in open communication with a convergence channel having a cross-section smaller than that of the primary channel, terminating in an orifice. In an alternate embodiment, a pair of speakers are utilized in a pair of enclosed rear chambers, each rear chamber in open communication with a primary channel of constant cross-section, each primary channel converging and joining in open communication with the convergence channel and terminating in an orifice. Additional embodiments include speaker enclosures with a front chamber adjacent a front side of the speaker to produce a pressure differential between the front chamber and the ambient air. The front chamber may have a sized opening to produce a regulated pressure flow.

8 Claims, 2 Drawing Sheets

LOUD SPEAKER ENCLOSURE

BACKGROUND

1. Field of Invention

This invention relates to a speaker enclosure, specifically to a speaker enclosure designed to improve sound through controlling an air pressure differential across the front and rear of a speaker cone.

2. Description of Prior Art

A variety of speaker enclosures are known in the prior at. The invention in U.S. Pat. No. 5,197,103 to Hayakawa discloses a low sound loudspeaker system consisting of an acoustic pipe extending from the back side of a loud speaker unit, an air chamber provided at the front side of the loud speaker unit, and a bass reflex port provided within the air chamber. The acoustic pipe communicates with the air chamber via the aperture of the acoustic pipe.

The invention in U.S. Pat. No. 5,514,841 issued to Rochon discloses a reflex compression valve—divided chamber sr cabinet. The Rochon cabinet contains ports located frontally and rearwardly within the speaker cabinet. The invention in U.S. Pat. No. 4,440,260 issued to Jacobson discloses a bass reflex enclosure or cabinet which achieves an acoustically dead front plate. In the Jacobson invention, the loud speak unit is mounted in an opening so that an annular slot is provided around the speaker unit and utilized as a bass-reflex port arranged coaxially with the speaker unit.

The invention disclosed in U.S. Pat. No. 5,173,575 issued to Surukawa comprises a compact acoustic apparatus in which a vibrator is arranged in a Helmholtz resonator having a resonance port and is driven to radiate the resident acoustic waves.

The invention disclosed in U.S. Pat. No. 5,517,573, to Polk, et al, discloses a vented loud speaker system with a port opening in a spear cabinet, and disk or baffle plates mounted at a pre-determined distance to and concentric to the port opening resulting in a vented system.

The invention disclosed in U.S. Pat. No. 5,327,504 issued to Hobelsberger discloses a loud speaker system using closed housing. The housing of the devices are divided by inner walls into two or three inner chambers. One inner chamber adjoins the membrane of the loud speaker and adjoining this inner chamber a membrane is built into an opening of an inner wall. Movements of the inner membrane caused by pressure changes in the chamber are servo supported by an inner electrodynamic transducer whose membrane lies parallel behind the other membrane. The supporting movements are caused by a control which tries to hold constant the distance between the two inner membranes.

The invention disclosed in U.S. Pat. No. 5,461,676 to Hobelsberger discloses devices to improve low frequency sound reproduction in loud speaker systems utilizing acoustically closed loud speaker housings.

The invention in U.S. Pat. No. 4,714,133 to Skaggs discloses a method for improving overall efficiency and quality in sound reproduction systems by providing a system which establishes positive phase control over resident sound characteristics by utilizing acoustically coupled drives. Conventional cone drivers are acoustically coupled to both air and the materials from which the enclosure of the speaker is formed by optimizing existing atmospheric pressure differentials and induced audio vibration readily available within these structures. The coupling is obtained for the use of acoustical resonator structures placed within a speaker enclosure and through particular distribution of mass in the enclosure and in the materials.

The invention disclosed in U.S. Pat. No. 4,008,374 to Tiefenbrun discloses a bass unit for a loudspeaker system having a pair of loudspeakers mounted one behind the other in a casing to define a chamber of air. The loudspeakers are operated in phase with one another so that the pressure of air in the chamber remains substantially constant allowing the forward loud speaker to operate in ideal conditions. The cabinet also includes a curtain of absorbent material in the chamber to absorb changes in sound pressure.

The invention disclosed in U.S. Pat. No. 5,374,124 to Edwards discloses a loud speaker system including electronic filtering to increase high frequency components beyond the audible range as well as a multi-compound Isobarik system having a single internal baffle within the loud speaker enclosure to allow acoustical drivers operating with similar frequency ranges to be physically located anywhere within the enclosure without limitation due to internal air pressure variations. Enclosure resonance is reduced by use of cylindrical prisms as structured elements. This disclosure further reveals an enclosure formed by a plurality of sub-enclosures.

None of the inventions in the prior art disclose a loud speaker system having a primary channel located at the rear of a loud s r in open communication with a convergence channel of diminishing cross-section which is open to ambient air.

SUMMARY OF INVENTION—OBJECTS AND ADVANTAGES

It is the primary object of this invention to provide a speaker enclosure that creates a pressure differential across the front and back of a speaker cone, thereby stretching the cone throughout its movement and eliminating any internal waves within the cone during its travel. It is also an object of the invention to produce a dampening effect on the movement of the cone, thereby reducing the possibility of the speaker bottoming during its travel. A further object of the invention is to control the peak pressure differential produced by the total volume of air in the speaker cabinet relative to the air the speaker can displace. An additional object of the invention is to control the duration of the pressure differential by the distance the sound waves produced by the rear of the speaker must travel to reach free air.

As described herein and properly manufactured the speaker enclosure would allow a speaker to produce sound free of secondary distortion and standing wave problems as seen in conventional speaker arrangements.

The description herein provides preferred embodiments of the present invention but should not be construed as limiting the scope of the speaker enclosure invention. Variations in the size and shape of the speaker utilized, the size and shape of the front side chamber, sized opening, primary channel, rear speaker chamber, convergence channel and orifice, and the number of speakers utilized can be incorporated into the present invention. Thus the scope of the present invention should be determined by the appended claims and their legal equivalents, rather than the examples given.

DETAILED DESCRIPTION OF THE PREFERRED EMBODIMENTS

Figure 2:
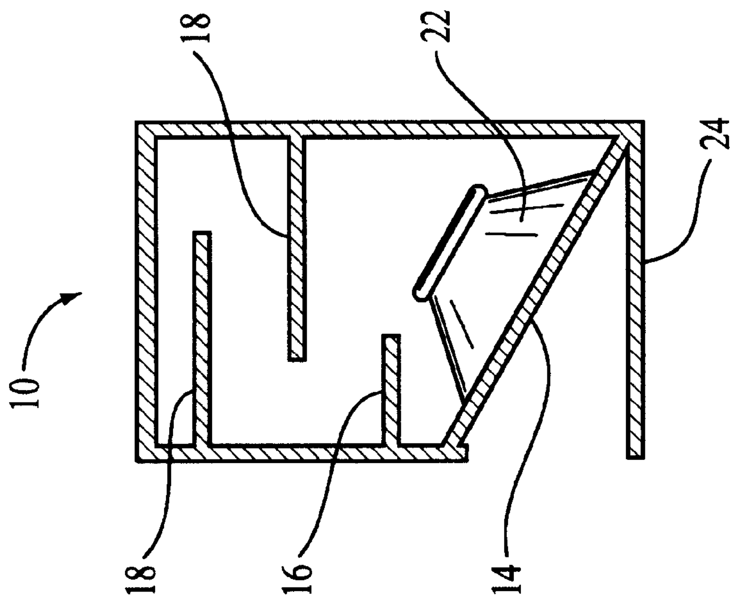
FIG. 2 is a sectional view of the speaker.
Figure 1:
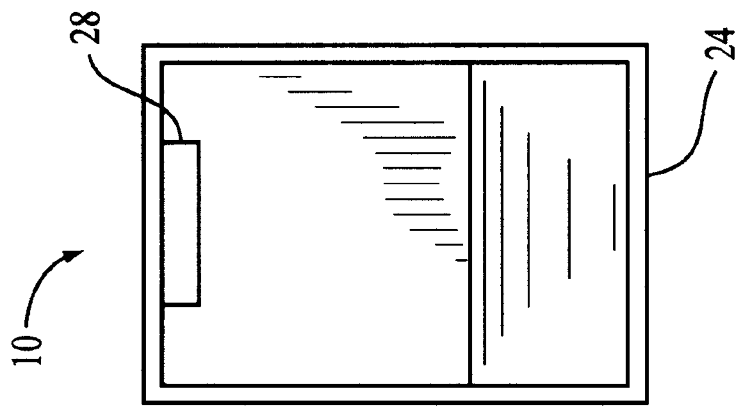
FIG. 1 is a front view of the speaker.

FIG. 1 shows a preferred embodiment of a speaker enclosure. Enclosure 10 is made up of a plurality of walls forming a generally rectangular box. A front surface of the enclosure has orifice 28 and front chamber sized opening 24. FIG. 2 is a cross-sectional view of a preferred embodiment. Enclosure 10 has a front chamber located adjacent a front portion of a speaker cone defined by inner panel 14 capable of securing the speaker in the walls of the enclosure, and typically having a sized opening to produce a regulated pressure flow. Small inner panel 16 and medium sized panels 18 define a primary channel in open communication with a rear chamber defined by a rear surface of inner panel 14 and the walls of the speaker enclosure. The primary channel is in open communication with a convergence channel defined by additional medium sized panels 18 and the walls of the enclosure, and is in open communication with ambient air by means of an orifice.

Figure 4:
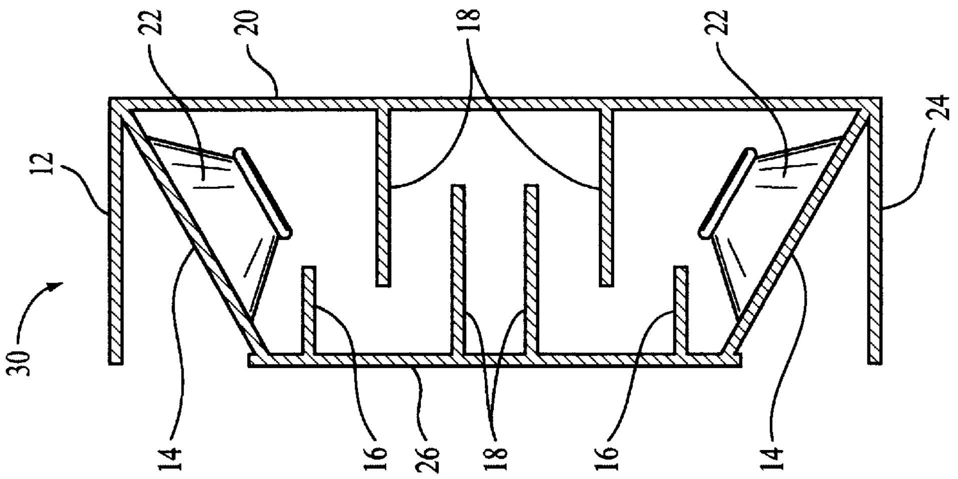
FIG. 4 is a sectional view of the speaker with an alternate speaker setup.
Figure 3:
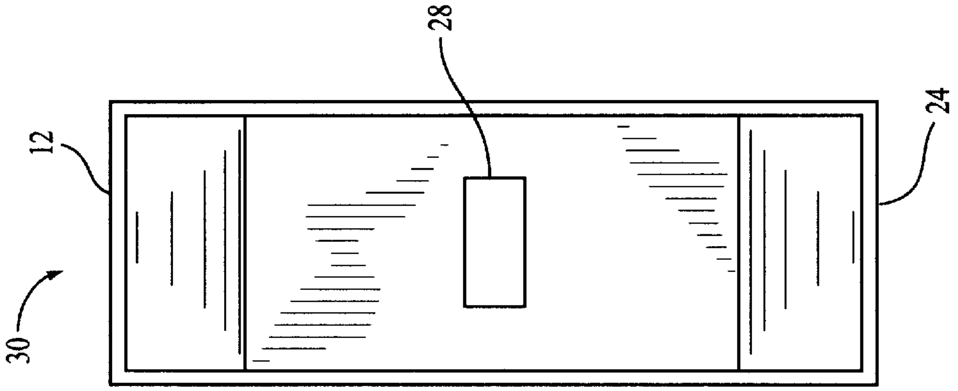
FIG. 3 is a front view of the speaker with an alternate speaker setup.

FIGS. 3 and 4 disclose an alternate embodiment of the invention utilizing two speakers. Enclosure 30 is defined by a plurality of walls in a generally rectangular fashion. FIG. 3 discloses top surface upper exterior panel of speaker casing 12 and, lower exterior panel of casing 24, and orifice 28.

FIG. 4 is a cross-sectional view of the alternate speaker enclosure having upper exterior surface 12, interior panel 14, small inner panels 16, and medium sized panel 18. Speakers 22 are attached to inner panel 14 in a conventional manner. A front speaker chamber is defined by inner panel 14 and the walls of the enclosure, and typically has a sized opening to produce a regulated pressure. A rear chamber is defined by a rear surface of inner panel 14 and the walls of the enclosure. The rear channel is in open communication with a primary channel defined by small inner panel and medium sized panels 16 and 18, and further is in open communication with a convergence channel defined by medium sized panels, 18. The convergence channel is exposed to ambient air via means of an orifice 28.

The enclosure dimensions are determined by utilizing the following formulas:

Rear Side $D_S$=Diameter of speaker $DA_S$=Sum of all speaker Diameters $X_C$=Cross section of channel (cubic inches)

$V_C$=Volume of Primary Channel (cubic inches)

$VC_C$=Volume of Convergence Channel (cubic inches)

$L_C$=Length of Primary Channel (inches)

$LC_C$=Length of Convergence Channel (inches)

$P_R$=Orifice area (inches)

$RC_I$=Rear Chamber Volume (cubic inches)

Z=Interior Height $$Z=D_S+1$$

$$V_C=Y(Z\times L_C) \text{ Where Y=3 Based on best test data to date}$$

$$VC_C=Y(Z\times LC_C)$$

$$L_C=D_S$$

$$X_C=V_C/L_C$$

$$P_R=0.75(DA_S)$$

$$RC_I=((DS-M)\times(0.5(DS)+2)/Z)+((DS-5)\times Y)\times Z$$

Front Side $D_S$=Diameter of Speaker

Z=Interior Height

W=Opening at front of Speaker $A_I$=Surface area of opening

H=Speaker Mounting Plate

O=Opposing Angle

M=Thickness of Material $C_I$=Volume inside cabinet at front of speaker (cubic inches)

$$Z=D_S+1$$

$$W=0.5(D_S)$$

$$A_I=(Z)(W)$$

$$H=\sqrt{}((DS-M)^2+(0.5(DS)+2)^2)$$

$$O=\tan\ (WB/(DS-M))^{-1}$$

$$C_I=((DS-M)\times(0.5(DS)+2)/Z)\times Z$$

What is claimed is:

1. A speaker enclosure formed of a plurality of walls having disposed within it a speaker cone having a front and a rear portion;

a rear chamber within said enclosure, formed by the rear portion of said speaker cone and said enclosure;

a primary channel of constant cross-section defined by the plurality of walls, said primary channel being in open communication with said rear chamber;

an opening disposed between said rear chamber and said primary channel, said opening being defined by the following dimensions:

$$\text{Rear Chamber}=((D_S-M)\times(._5(Ds)+2)/Z)+((D_S-5)\times Y)\times Z$$

where $D_S$=diameter of said speaker cone, M=cross-sectional thickness of material used in plurality of walls comprising said speaker enclosure $$Z=D_S+1$$

$$Y=3$$

a convergence channel formed by said plurality of walls and by a plurality of panels disposed within said enclosure, said convergence channel having a cross-section smaller than that of said primary channel and having a diminishing cross-section throughout its length in open communication with said primary channel;

an orifice disposed within said enclosure adjacent to and in communication with said convergence channel.

2. The speaker enclosure of claim 1 having disposed within it a pair of speaker cones each having a front portion and a rear portion;

a pair rear chambers formed by each rear portion of each speaker cone and said enclosure;

a pair of primary channels of constant cross-section defined by the plurality of walls in open communication with each rear chamber, each rear chamber having an opening between said rear chamber and said primary channel defined by the following dimensions:

$$\text{Rear Chamber}=((D_S-M)\times(._5(Ds)+2)/Z)+((D_S-5)\times Y)\times Z$$

where $D_S$=diameter of said speaker cone

M=cross-sectional thickness of material used in plurality of walls comprising said speaker enclosure $$Z=D_S+1$$

$$Y=3;$$

a pair of convergence channels having a cross-section smaller than that of each said primary channel, each convergence channel having a diminishing cross-section throughout its length in open communication with each said primary channel formed by said plurality of walls and by plurality of panels disposed within said enclosure;

an orifice disposed within said enclosure adjacent to and in communication with said convergence channels.

3. The speaker enclosure of claims 1 or 2 further comprising a front chamber formed by said front portion of said speaker cone and said plurality of walls of said enclosure in open communication with ambient air by means of a sized opening in said speaker enclosure, said sized opening producing a regulated pressure flow thus creating a pressure differential between the front chamber and ambient air.

4. The speaker enclosure of claims 1 or 2 wherein said primary channel is of defined dimension, determined as follows:

$$Z=D_S+1$$

$$V_C=Y(Z\times L_C)$$

$$L_C=D_S$$

$$X_C=V_C/L_C$$

where Y=3

Z=height of the speaker enclosure $X_C$=cross-section of channel $V_C$=volume of channel $L_C$=length of channel.

5. The speaker enclosure of claims 1 or 2 wherein said convergence channel is of defined dimension, determined as follows:

$$VC_C=0.5(V_C)$$

$$LV_C=(D_S)-4$$

$VC_C$=volume of convergence channel $LV_C$=length of convergence channel.

6. The speaker enclosure of claims 1 or 2 wherein said orifice is of defined dimension, determined as follows:

$$0.75[(N_S)(D_S)]$$

$N_S$=number of speaker drivers $D_S$=diameter of speaker drivers.

7. The speaker enclosure of claims 1 or 2 wherein said front chamber is of defined dimension, determined as follows:

$$C_i=((D_S-M)\times(0.5(D_S)+2)/Z)\times Z$$

$C_i$=front chamber $D_S$=diameter of speaker cone

M=cross-sectional thickness of material used in walls

Z=height of speaker enclosure.

8. The speaker enclosure of claim 3 wherein said front chamber opening is of defined dimension, determined as follows:

$$W=0.5(D_S)$$

W=front chamber opening $D_S$=diameter of speaker cone.

* * * * *